US005717171A

United States Patent [19]

Miller et al.

[11] Patent Number: 5,717,171

[45] Date of Patent: Feb. 10, 1998

[54] ACOUSTICAL CABINET GRILLE FRAME

[75] Inventors: Gregory L. Miller, Grayslake, Ill.; John P. Zick, Twin Lake, Wis.

[73] Assignee: The Solar Corporation, Libertyville, Ill.

[21] Appl. No.: 749,934

[22] Filed: Nov. 14, 1996

Related U.S. Application Data

[60] Provisional application No. 60/017,111 May 9, 1996.

[51] Int. Cl.[6] .......... H05K 5/00

[52] U.S. Cl. .......... 181/150; 181/199

[58] Field of Search .......... 181/148, 150, 181/175, 199; 381/88

[56] References Cited

U.S. PATENT DOCUMENTS

| | | | |
|---|---|---|---|
| 4,244,096 | 1/1981 | Kashichi | 181/199 X |
| 4,325,455 | 4/1982 | Kirkpatrick . | |
| 4,650,031 | 3/1987 | Yamamoto . | |
| 4,919,227 | 4/1990 | Chicoine . | |
| 4,934,480 | 6/1990 | Gaté et al. . | |
| 4,936,410 | 6/1990 | Howell . | |
| 4,974,698 | 12/1990 | Smith . | |
| 5,113,968 | 5/1992 | Lemmon . | |
| 5,322,979 | 6/1994 | Cassity et al. . | |
| 5,412,162 | 5/1995 | Kindel | 181/150 |

FOREIGN PATENT DOCUMENTS

| | | |
|---|---|---|
| 27 38 526 | 10/1978 | Germany . |
| 27 38 295 | 2/1979 | Germany . |

*Primary Examiner*—Khanh Dang
*Attorney, Agent, or Firm*—Bell, Boyd & Lloyd

[57] ABSTRACT

The present invention reveals a unitary or one-piece acoustical cabinet grille frame and a method for making the one-piece grille frame. In the unitary acoustical cabinet grille frame a sound-transmissible fabric is integrally bonded or fused to serrations in a slot within the shaped plastic face. In the method for manufacturing the one-piece acoustical cabinet grille frame, a sound-transmissible fabric is placed over a shaped plastic face. A heated fusion blade having the configuration of the slot is placed over the sound-transmissible fabric. The fabric is forced into contact with the plastic serrations in the slot and the plastic serrations are plasticated or melted. The sound-transmissible fabric is then fused with the plastic. Finally, the heated fusion blade is removed from the slot and the plastic is allowed to cool.

7 Claims, 5 Drawing Sheets

ACOUSTICAL CABINET GRILLE FRAME

BACKGROUND OF THE INVENTION

1. Field of the Invention

The present invention relates to a cabinet grille having a face composed of a decorative sound transmissible fabric. Such frames are widely employed as a face place or covering for sound speakers commonly used in television, radio, stereo, and other similar sound systems.

For many years, the manufacturing of speaker cabinets has required the use of two components to provide face accented detailing. Herein, we provide a means whereby one may apply a decorative sound transmissible fabric in a specific localized area to a decorative shaped plastic substrate for the transmission of sound through the same.

2. Description of the Related Art

Prior to the present discovery, the market was forced to use a product which had no face accented detailing without the use of a separate component part as an insert. A description of the patented products currently available is as follows:

U.S. Pat. No. 4,936,410 (Howell) discloses a speaker cover made of a flaccid material. The material has a band of felt, Velcro®, along its outer border. A speaker is provided with a hook fastener, Velcro®, along its outer border. The material is fastened to the speaker by contacting the band of felt with the hook fastener. The speaker cover is thereby attached to the speaker.

U.S. Pat. No. 5,322,979 (Cassity et al.) discloses a two-piece speaker cover assembly. The first piece is a speaker cover that can be made from cloth-like material which can be stretched over the frame body. The second piece is a molded frame body having a channel with a first rib and a second rib. The channel, first rib and second rib are located on the side of the frame body facing the speaker. In addition, the channel does not contain any serrations.

U.S. Pat. No. 4,325,455 (Kirkpatrick) discloses a two-piece speaker grille. The first piece is a cover that is made from a stiffened, resilient, fibrous cloth material which covers a grille. The second piece is the grille and it includes a groove, which does not contain any serrations.

German Patent 27 38 526 (Hennel) discloses a loudspeaker box having a front cover plate and a frame. The frame contains beading to which a cover may be fixed. U.S. Pat. No. 4,934,480 (Gate et al.) discloses a cover that can be fixed to an electrical instrument, including a loudspeaker. The cover contains two types of fastening lugs which fit into slots in the casing of the instrument.

U.S. Pat. No. 4,974,698 (Smith) discloses a frameless pierced metal speaker. German patent 27 38 295 (Gaus) discloses a speaker frame made from a metal-plastic-metal sandwich. U.S. Pat. No. 5,113,968 (Lemmon) discloses a three-piece speaker grill assembly containing a perforated screen detachably connected to a grill with a pad between the grill and screen. U.S. Pat. No. 4,650,031 (Yamamoto) discloses a cabinet for a loudspeaker. U.S. Pat. No. 4,919,227 (Chicoine) discloses a speaker grille which has two sets of misaligned sound transmitting holes.

None of these patents discloses a unitary or one-piece acoustical cabinet grille frame having a sound-transmissible fabric integrally bonded or fused to a shaped plastic face of the grille frame.

SUMMARY OF THE INVENTION

The present invention is for a unitary or one-piece acoustical cabinet grille frame and a method for making the one-piece grille frame.

In the unitary or one-piece acoustical cabinet grille frame, a sound-transmissible fabric is integrally bonded to a shaped plastic face of the grille frame. The shaped plastic face contains a slot having an inner wall, a base, and an outer wall, and the slot contains serrations projecting upward from the base. In the unitary or one-piece acoustical cabinet grille frame, the sound-transmissible fabric is integrally fused to the serrations in the slot in the shaped plastic face.

In the unitary or one-piece acoustical cabinet grille frame, the sound-transmissible fabric has a melting point higher than that of the shaped plastic face, preferably about 100 degrees Fahrenheit higher, more preferably about 150 degrees Fahrenheit higher, and most preferably about 175 degrees Fahrenheit higher than that of the shaped plastic face. The sound-transmissible fabric is preferably selected from the group consisting of polyester, cotton, polyolefin, polyamid and polyacrylic.

The shaped plastic face of the unitary or one-piece acoustical cabinet grille frame is a thermoplastic preferably selected from the group consisting of polyurethane, polypropylene, polystyrene, polyethylene, polyamid, polyacrylic, polyacetal, polycarbonate, acrylonitrile-butadine-styrene and polyvinyl chloride.

In the method for manufacturing a unitary or one-piece acoustical cabinet grille frame, a sound-transmissible fabric is placed over a shaped plastic face. The shaped plastic face contains a slot having an inner wall, a base, and an outer wall, and the slot contains plastic serrations projecting upward from the base. A heated fusion blade having the configuration of the slot is placed over the sound-transmissible fabric. The fabric is forced into contact with the plastic serrations in the slot and the plastic serrations are plasticated or melted. The sound-transmissible fabric is then fused with the plasticated or melted plastic by allowing the plasticated or melted plastic to embed into the fabric. Finally, the heated fusion blade is removed from the slot and the plasticated or melted plastic is allowed to cool.

In the method, the sound-transmissible fabric has a melting point higher than that of the shaped plastic face, preferably about 100 degrees Fahrenheit higher, more preferably about 150 degrees Fahrenheit higher and most preferably about 175 degrees Fahrenheit higher than that of the shaped plastic face. The sound-transmissible fabric is preferably selected from the group consisting of polyester, cotton, polyolefin, polyamid and polyacrylic.

The shaped plastic face of the unitary or one-piece acoustical cabinet grille frame is a thermoplastic preferably selected from the group consisting of polyurethane, polypropylene, polystyrene, polyethylene, polyamid, polyacrylic, polyacetal, polycarbonate, acrylonitrile-butadine-styrene and polyvinyl chloride.

DETAILED DESCRIPTION OF THE INVENTION

Figure 1:
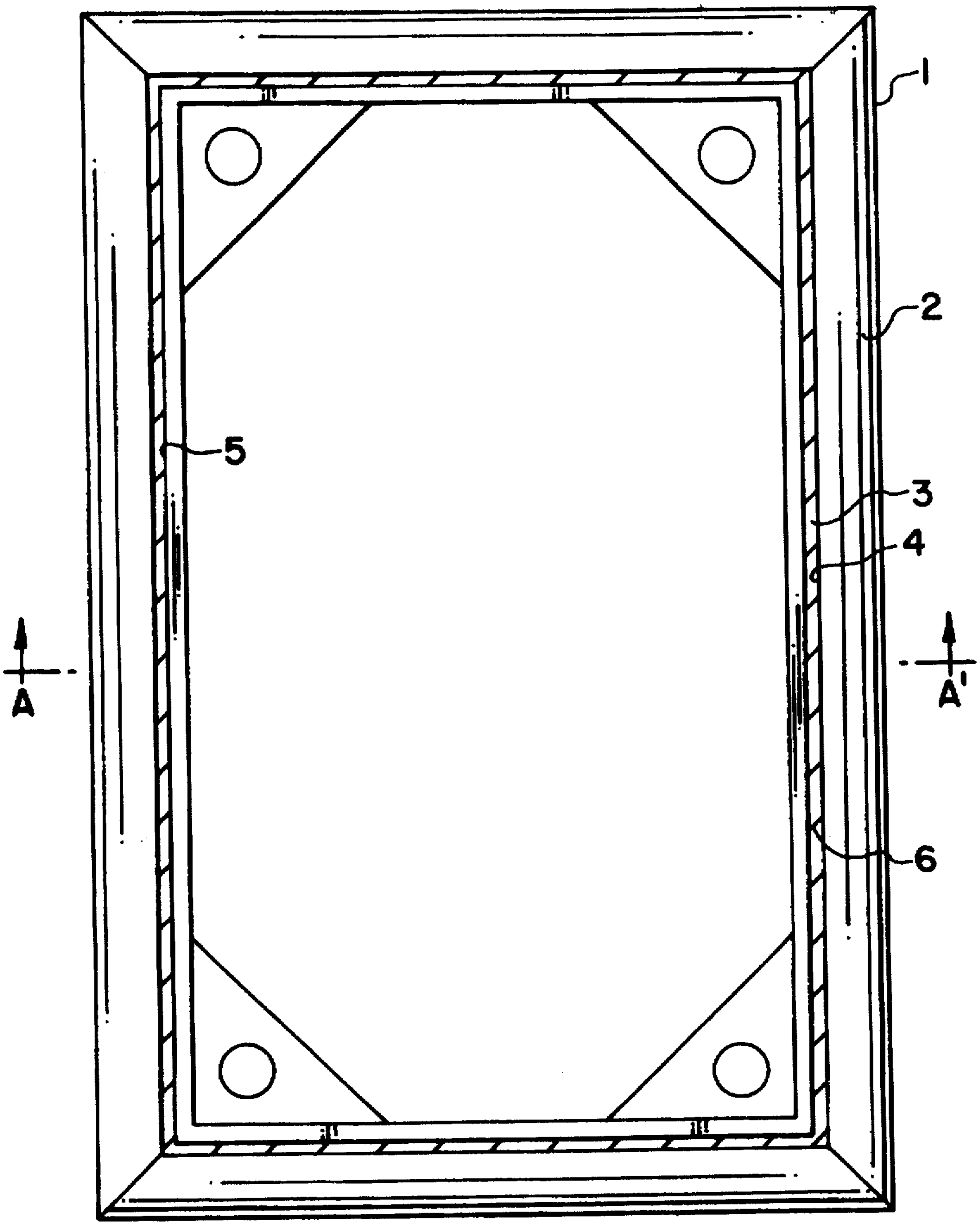
FIG. 1 shows a shaped plastic face for a decorative covering of a speaker.
Figure 2:
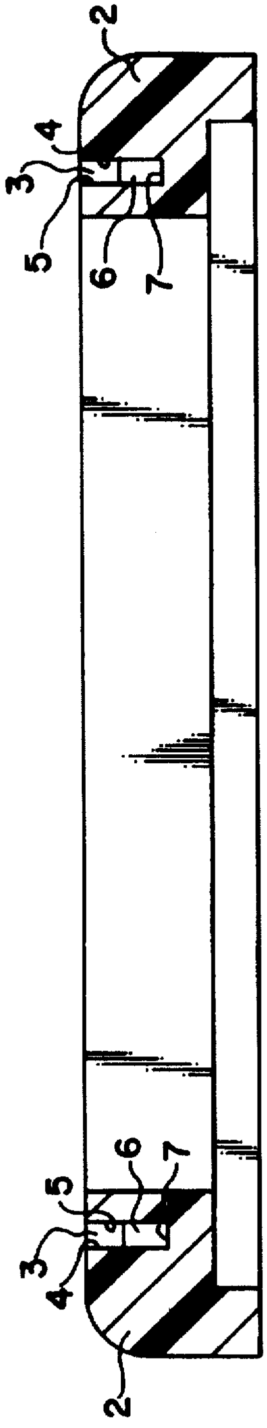
FIG. 2 shows a cross-section of the shaped plastic face along line A—A' of FIG. 1.

The present invention can be better understood with reference to the accompanying drawings wherein FIG. 1 depicts a shaped plastic face 1 for a decorative covering of a speaker composed of a substrate 2 provided with a slot or vein line 3. A cross-section of the face 1 along line A—A' is depicted in FIG. 2. The slot 3 defines the area of the face 1 to be accented by a sound-transmissible fabric 8. The slot 3 is formed with an inner wall 5 and an outer wall 4 and has disposed therein serrated projections 6 extending between the inner wall 5 and the outer wall 4 and upward from the base 7 of the slot 3 to a desired height below the top of the slot 3. The serrated projections 6 may include notches, ridges or other protrusions designed to increase surface area. The serrated projections 6 may be perpendicular to the plane of the inner wall 5 and outer wall 4 or at an angle thereto, e.g., 45 degrees. The specific angle is not critical.

The invention allows for the use of a single piece construction regarding the decorative shaped plastic part 1 and fusion of a sound-transmissible fabric 8 onto at least a part of the face of same without the use of adhesives. Thus, the process of preparing the finished product simultaneously stretches and bonds the cloth cover 8 to the face 1 in the bonding slot 3 with the serrations 6 oriented to maximize bond contact area between the face cloth 8 and the contact area in the slot 3.

In practice, a piece of porous fabric 8 having the general shape defined by the slot perimeter of the area to be accented is placed over the slot 3. A heated fusion blade (having the configuration of the slot perimeter) is placed over the fabric 8 with pressure to force the fabric edge into the slot 3 and onto the projecting serrations 6 in such a manner so as to melt the plastic serrations 6 whereby the melted plastic is embedded into the fabric 8 through the wicking of the plastic melt into the porous fabric 8.

The nature of the porous fabric 8 is not critical and can be composed of any suitable elastic or stretchable fabric such as polyester, cotton, polyolefin, polyamid, polyacrylic, etc. It is important, however, that the fabric 8 have a melting point sufficiently higher than that of the plastic such that the heat from the heated fusion blade does not cause deterioration of the fabric 8. Generally speaking, a melting point difference of from about 100 to 175 degrees Fahrenheit is sufficient.

Figure 3:
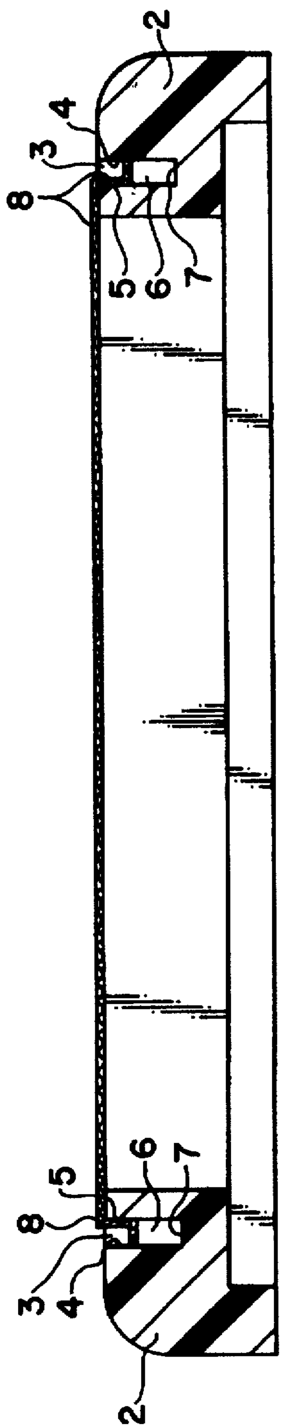
FIG. 3 shows a cross-section of a unitary or one-piece acoustical cabinet grille frame. The sound-transmissible fabric is fused to serrations in a slot in the shaped plastic face.

The fusion blade can be made of any suitable material such as stainless steel, chrome, carbon steel, bronze or the like. Typically for polyester fabric 8 and polystyrene substrate 2, the heated fusion blades are held at a temperature of 500 degrees Fahrenheit in the contact position, i.e., in the slot 3 with the polyester fabric 8 forced therein between the inner wall 5 and the outer wall 4 with an approximate 8 second dwell. For example, one 5" diameter by 6" stroke cylinder may be used to apply pressure at approximately 40 psi, which results in the application of 785 pounds of force over the entire blade area. Upon withdrawal of the fusion blade and cooling of the melted plastic, a firm and integral bond is formed or fused between the face 1 and the fabric 8, as shown in FIG. 3.

The blades are heated via conductive heat transfer and used with calrods. This is accomplished with the use of a die set. The die set consists of the following:

1) A top portion contains the base of the set with the bushings. The top half is cross-drilled around the die bushings so that water will run through the set to remove any heat transferred to the top of the die and the die bushings, eliminating the possibility of die lock up due to heat expansion.

2) An insulating block of marlite approximately one inch thick is then placed on the iside top of the upper portion of the die set. This further acts as an insulator.

3) Aluminum block approximately three quarters of an inch thick is milled out to accept the calrod heaters. Additionally, base support blocks for the blade are bolted to the calrod plate.

4) The blade support blocks consist of aluminum contoured to the approximate shape of the blade relative to the X–Y configuration. The blocks consist of an inner mount and an outer mount with the blade sandwiched in between the two. The inner mount is bolted onto the calrod plate, the blade is shaped to fit the contour of the inner mount, and clearance holes are drilled into the blade. The outer mount is also contoured to fit the opposite side of the blade, with clearance holes drilled to accept bolts. The outer mount is bolted to the inner mount, thus securing the blade in between. The blade additionally has a contour in the Z direction cut into it so that it exactly matches the contour of the molded substrate. A temperature sensing device, i.e., a thermo-couple, is attached to a surface on the outer mount. This acts as a regulator for the blade.

Where it is necessary due to part geometry, height and/or variations to incorporate zoning, i.e., differential heating of various sections of the blade, a scenario similar to the above is performed. The difference being that the various zones are thermally isolated from each other and have the advantage of having the individual isolations separately heated and controlled, i.e., zoned. This modification is advantageous where varying cross-sections of the blade differ and is used to compensate for differential heating of the blade, thus presenting a uniform heat at the blade surface to the part regardless of the blade cross section.

To the bottom half of the die set, i.e., the portion containing the leader pins, a fixture is placed to positively locate the part relative to the blade. This fixture indicates off of a set of points on the part and supports the blade contact area underneath the part. Additionally, provisions to locate the cloth are made on this portion of the tooling as well. Depending on part configuration, this can range from standing posts outboard of the part, which will mate up to die cut holes in the outer edge of the cloth and will be wrapped over a non-critical area to properly position the cloth in the X–Y direction. In the case of completely wrapped cloth insets, removable arms are placed such that the cloth can be referenced off of them, i.e., L-bracketed, and prior to blade contact with the part the arms are moved out of the way.

Figure 4:
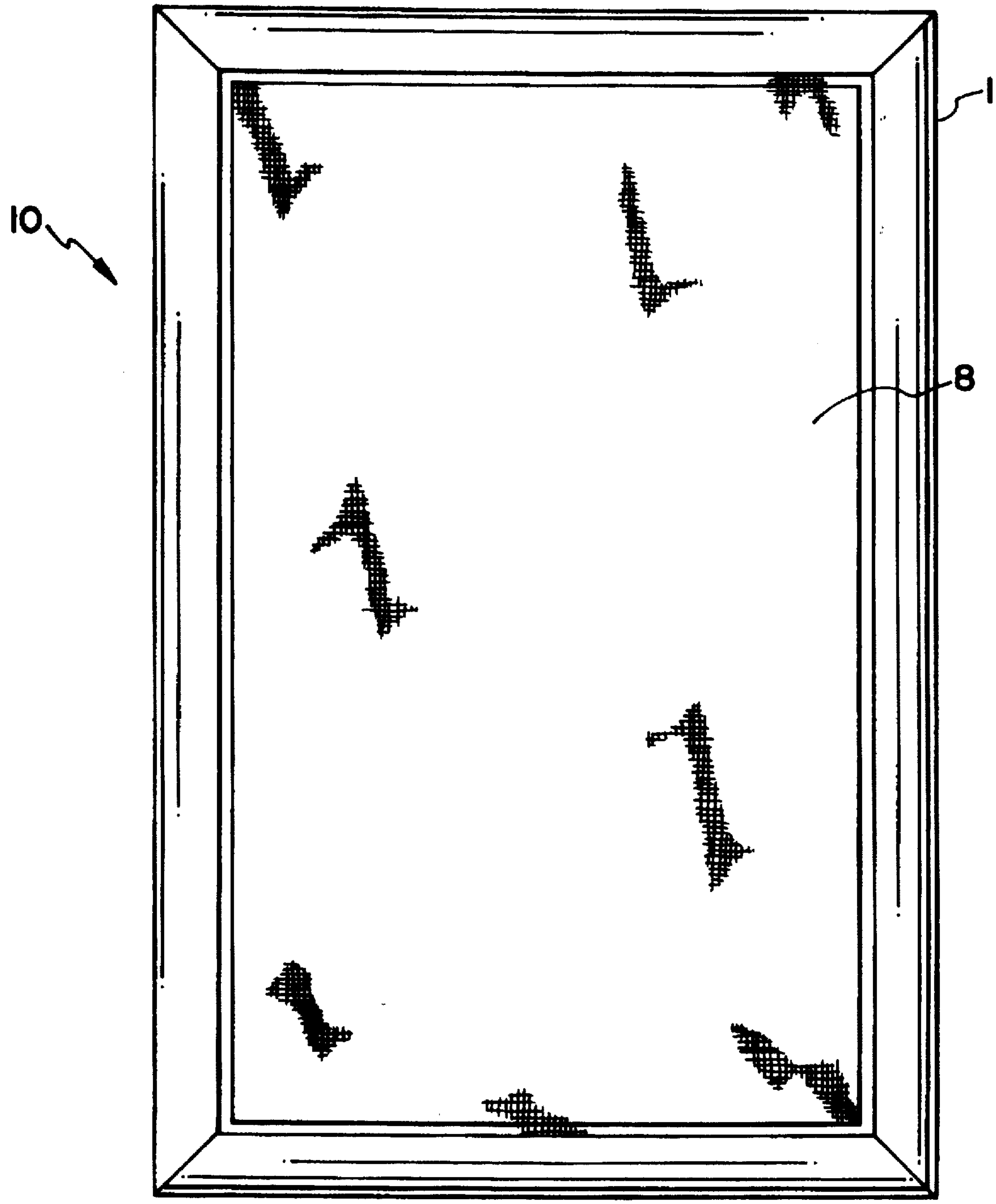
FIG. 4 shows a front view of the unitary or one-piece acoustical cabinet grille frame with the sound-transmissible fabric fused to serrations in a slot in the shaped plastic face.

FIG. 4 shows a front view of the finished unitary or one-piece acoustical cabinet grille frame 10 with the sound-transmissible fabric 8 fused to serrations in a slot in the shaped plastic face 1.

Figure 5:
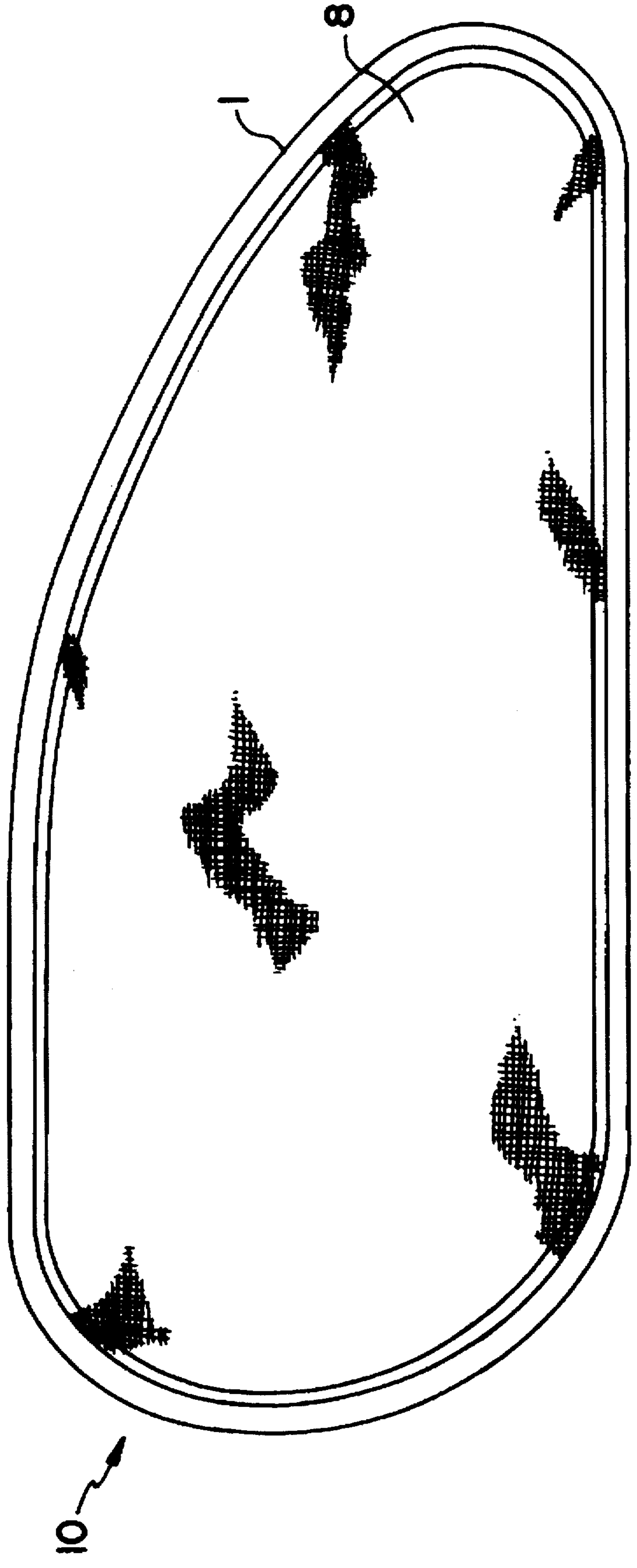
FIG. 5 shows a front view of an oval- or elliptical-shaped embodiment of the unitary or one-piece acoustical cabinet grille frame.
Figure 6:
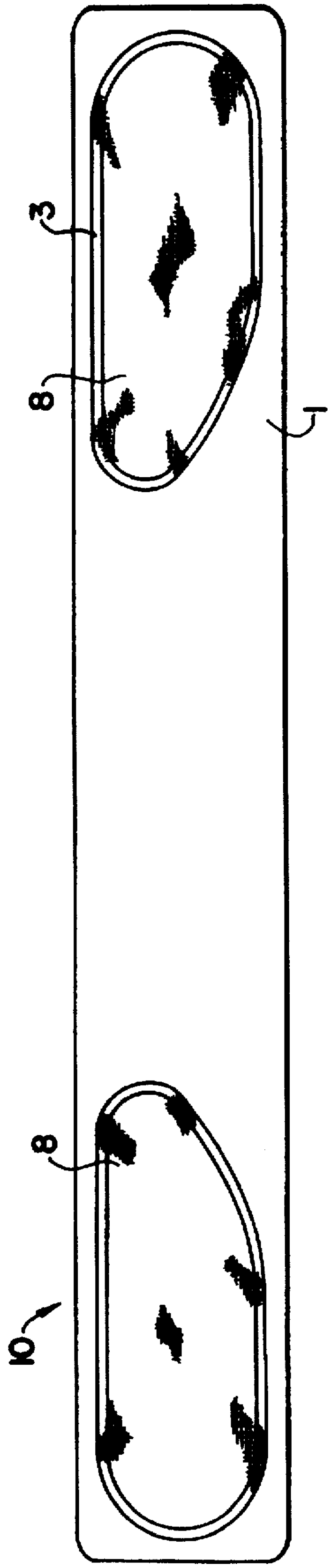
FIG. 6 shows a front view of an embodiment of the unitary or one-piece acoustical cabinet frame with two pieces of sound-transmissible fabric fused to serrations in two separate slots in the shaped plastic face.
Figure 7:
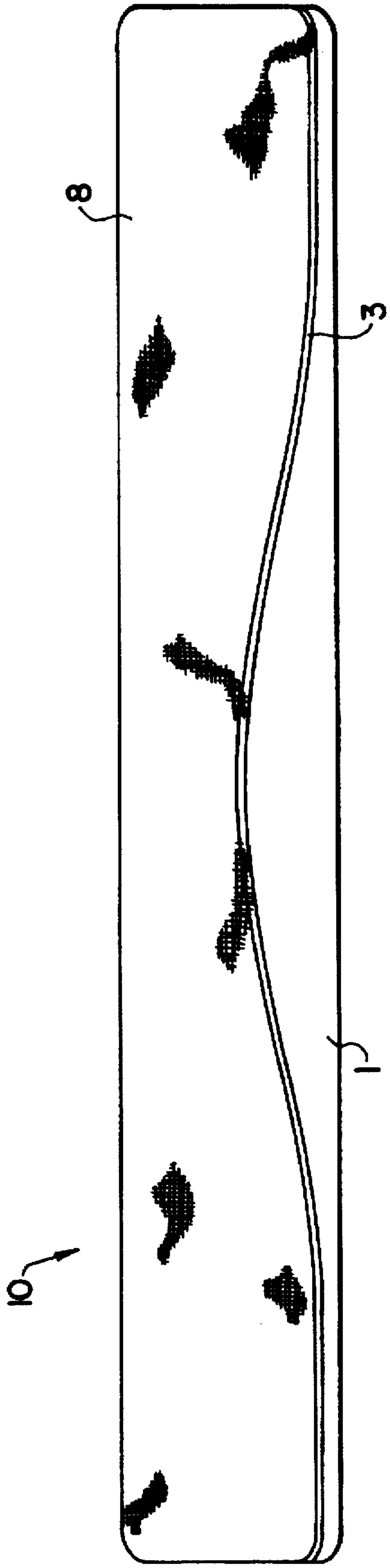
FIG. 7 shows a front view of another embodiment of the unitary or one-piece acoustical cabinet frame with the sound-transmissible fabric fused to serrations in a slot in the shaped plastic face. In this embodiment, the slot traverses the length of the bottom of the frame. The sound-transmissible fabric is attached with adhesive to the sides and top of the frame.

FIGS. 5–7 show other embodiments of the present invention. More specifically, FIG. 5 shows a front view of an oval-shaped embodiment of the unitary or one-piece acoustical cabinet grille frame 10. FIG. 6 shows a front view of an embodiment with two pieces of sound-transmissible fabric 8 fused to serrations in two separate slots in the shaped plastic face 1.

FIG. 7 shows an embodiment with the sound-transmissible fabric 8 fused onto at least a part of the face 1 without the use of adhesives. In this embodiment, the slot 3 traverses the length of the bottom of the face 1. The sound-transmissible fabric 8 is attached with adhesives to the sides and top of the face 1.

The nature of the plastic material used to form the face structure 1 is not critical and can be selected from any conventional materials used, including polyurethane, polypropylene, polystyrene, polyethylene, polyamid, polyacrylic, polyacetal or any other satisfactory material.

The unitary or one-piece acoustical cabinet grille frame can be attached to the cabinet by any conventional method. For example, the grille may be attached to the cabinet by screws through the face of the cabinet into the grille. This method results in a non-removable grille. The grille may also be permanently attached to the cabinet by pal nuts.

In addition, the grille may be attached to the cabinet with catch cups. The catch cup is a rubber grommet slightly undersized with respect to the foot of the grille. The catch cup attachment results in an easily removable grille. The grille may also be attached to the cabinet by hook and ring Velcro® strips. This method also results in an easily removable grille.

Finally, it should be noted that these methods of attachment may be used in combination. Thus, screws, pal nuts, catch cups and Velcro® strips may be used in any combination based upon the designer's needs.

EXAMPLE 1

A one-piece acoustical cabinet grille frame of the present invention was made by placing a 29"×5" piece of sound-transmissible polyester fabric over a portion of a polystyrene molded substrate containing a face accented vein line. The vein line contained an inner wall, a base and an outer wall. The depth of the vein line was approximately one-quarter inch and contained several hundred plastic serrations projecting upward from the base. The serrations were one-eighth inch in height from the base and were situated at an angle of 45 degrees to the plane of the inner and outer walls of the vein line.

A heated fusion blade having the configuration of the vein line and a temperature of 520 degrees Fahrenheit was placed over a portion of the sound-transmissible polyester fabric. The polyester fabric had a melting point of 700 degrees Fahrenheit. The heated fusion blade contacted the sound-transmissible polyester fabric and forced the fabric between the inner and outer walls into contact with the polystyrene serrations in the slot. An eight second dwell was used with one 5" diameter by 6" stroke cylinders to apply a force at 40 psi which resulted in the application of 785 lbs. of force over the entire blade area.

The heat from the fusion blade plasticated or melted the polystyrene serrations and caused the polystyrene to embed into the polyester. The heated fusion blade was then removed from the slot and the plastic was allowed to cool at room temperature. As a result of the plasticating and embedding of the polystyrene, the polyester fabric was integrally bonded or fused to the serrations of the vein line in the grille area. The remaining sides of the cloth area were hand detailed and attached using conventional gluing techniques.

The resultant product is shown in FIG. 7. Thus, this manufacturing method resulted in the production of a unitary or one-piece acoustical cabinet grille frame having only a portion of the exposed face accented with cloth and the rest of the face accented with a painted material over the polystyrene.

EXAMPLE 2

By using different blade configurations and a die set, a one-piece acoustical cabinet grille frame of the present invention was made by placing two 8" by 3" elliptical-shaped pieces of sound transmissible polyester fabric into areas accented on a polystyrene molded substrate of approximately 7" by 2.5" inches each. The shaped plastic substrate was made of polystyrene and contained two fully enclosed accented slots, each slot having an inner wall, a base and an outer wall. The depth of the slot was approximately one-quarter inch and contained several hundred plastic serrations projecting upward from the base. These serrations were one-eighth of an inch from the base and were situated at an angle of 45 degrees to the plane of the inner and outer walls of the slots.

Heated fusion blades having the configuration of the slots and a temperature of approximately 525 degrees Fahrenheit were placed over the sound-transmissible polyester fabric via the use of a die set. The polyester fabric had a melting point of approximately 700 degrees Fahrenheit. The heated fusion blades contacted the sound-transmissible polyester fabric and simultaneously forced the fabric between the inner and outer walls of the two slots into contact with the polystyrene serrations in the slots. A ten second dwell was used with one 5" diameter by 6" stroke cylinder to apply a force at 35 psi which resulted in the application of 688 lbs. of force over the two blade areas.

The heat from the fusion blades plasticated or melted the polystyrene serrations and caused the polystyrene to embed into the polyester. The heated fusion blades were then removed from the slots and the plastic was allowed to cool at room temperature. As a result of the plasticating and embedding of the polystyrene into the polyester, the polyester fabric was integrally bonded or fused to the serrations of the shaped plastic face of the grille frame.

The resultant product is shown in FIG. 6. Thus, this manufacturing method resulted in the production of a unitary or one-piece acoustical cabinet grille frame with two separately accented cloth areas exposed onto a portion of the face of the product.

While the invention has been described in connection with what is presently considered to be the most practical and preferred embodiments, it is to be understood that the invention is not limited to the disclosed embodiments, but on the contrary is intended to cover various modifications and equivalent arrangements included within the spirit and scope of the appended claims.

Thus, it is to be understood that variations in the present invention can be made without departing from the novel aspects of this invention as defined in the claims. All patents cited herein are hereby incorporated by reference in their entirety and relied upon.

What is claimed is:

1. A unitary or one-piece acoustical cabinet grille frame, comprising:

a) a shaped plastic face, wherein the shaped plastic face contains at least one slot having an inner wall, a base, and an outer wall, and the slot contains serrations projecting upward from the base; and b) a sound-transmissible fabric, wherein the sound-transmissible fabric is integrally fused to the serrations in the slot in the shaped plastic face.

2. The unitary or one-piece acoustical cabinet grille frame of claim 1, wherein the sound-transmissible fabric has a melting point higher than that of the shaped plastic face.

3. The unitary or one-piece acoustical cabinet grille frame of claim 2, wherein the sound-transmissible fabric has a melting point about 100 degrees Fahrenheit higher than that of the shaped plastic face.

4. The unitary or one-piece acoustical cabinet grille frame of claim 2, wherein the sound-transmissible fabric has a melting point about 150 degrees Fahrenheit higher than that of the shaped plastic face.

5. The unitary or one-piece acoustical cabinet grille frame of claim 2, wherein the sound-transmissible fabric has a melting point about 175 degrees Fahrenheit higher than that of the shaped plastic face.

6. The unitary or one-piece acoustical cabinet grille frame of claim 1, wherein the sound-transmissible fabric is selected from the group consisting of polyester, cotton, polyolefin, polyamid and polyacrylic.

7. The unitary or one-piece acoustical cabinet grille frame of claim 1, wherein the shaped plastic face is a thermoplastic selected from the group consisting of polyurethane, polypropylene, polystyrene, polyethylene, polyamid, polyacrylic, polyacetal, polycarbonate, acrylonitrile-butadine-styrene and polyvinyl chloride.

* * * * *